United States Patent
Miyano et al.

(10) Patent No.: US 6,891,232 B2
(45) Date of Patent: May 10, 2005

(54) SEMICONDUCTOR DEVICE HAVING AN INJECTION SUBSTANCE TO KNOCK AGAINST OXYGEN AND MANUFACTURING METHOD OF THE SAME

(75) Inventors: Kiyotaka Miyano, Kanagawa (JP); Kazuya Ohuchi, Kanagawa (JP); Ichiro Mizushima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/354,094

(22) Filed: Jan. 30, 2003

(65) Prior Publication Data

US 2003/0141549 A1 Jul. 31, 2003

(30) Foreign Application Priority Data

Jan. 31, 2002 (JP) ........................................ 2002-023548

(51) Int. Cl.$^7$ ........................... H01L 29/94; H01L 29/76
(52) U.S. Cl. ...................... 257/368; 257/213; 257/214; 257/369; 257/382; 257/383; 257/384; 257/386; 257/339; 438/301; 438/305; 438/528; 438/653; 438/643
(58) Field of Search ............................... 257/213, 214, 257/368, 369, 382, 383, 384, 386

(56) References Cited

U.S. PATENT DOCUMENTS

| | | | |
|---|---|---|---|
| 6,008,124 A | * 12/1999 | Sekiguchi et al. | ........... 438/653 |
| 6,207,995 B1 | * 3/2001 | Gardner et al. | ............. 257/344 |
| 6,346,732 B1 | 2/2002 | Mizushima et al. | |
| 6,475,868 B1 | * 11/2002 | Hao et al. | ................... 438/301 |

FOREIGN PATENT DOCUMENTS

| | | |
|---|---|---|
| JP | 9-8297 | 1/1997 |
| JP | 2000-323689 | 11/2000 |
| JP | 2001-189451 | 7/2001 |

* cited by examiner

Primary Examiner—Minhloan Tran
Assistant Examiner—Tan Tran
(74) Attorney, Agent, or Firm—Finnegan, Henderson, Farabow, Garrett & Dunner, L.L.P.

(57) ABSTRACT

A semiconductor device comprises: a semiconductor substrate; a gate insulating film formed on the top surface of the semiconductor substrate; a gate electrode formed on the gate insulating film; diffusion layers formed in the semiconductor substrate to be used a source layer and a drain layer; and a silicide layer formed to overlie the diffusion layers; wherein an oxygen concentration peak, where oxygen concentration is maximized, is at a level lower than said top surface in a cross-section taken along a plane perpendicular to said top surface.

9 Claims, 11 Drawing Sheets

SEMICONDUCTOR DEVICE HAVING AN INJECTION SUBSTANCE TO KNOCK AGAINST OXYGEN AND MANUFACTURING METHOD OF THE SAME

CROSS-REFERENCE TO RELATED APPLICATIONS

This application is based upon and claims the benefit of priority from the prior Japanese Patent Application(s) No(s). 2002-23548, filed on Jan. 31, 2002, the entire contents of which are incorporated herein by reference.

BACKGROUND OF THE INVENTION

1. Field of the Invention

This invention relates to a semiconductor device and a method of manufacturing a semiconductor device.

2. Related Background Art

Integrated circuits having MOS transistors are becoming more and more enhanced in terms of microminiaturization and operation speed. To prevent short-channeling effects such as punch-through along with the microminiaturization of MOS transistors, relatively shallow source and drain diffusion layers are formed.

To ensure high-speed operations of MOS transistors, the SALCIDE (Self-Aligned Silicide) technique is frequently used, as it reduces the contact resistance between the diffusion layers and a metal by forming a silicide layer on the diffusion layers in self-alignment. In the SALICIDE technique, silicide is formed by the interaction between the deposited metal and silicon as the substrate material. Therefore, in case a metal is directly deposited on shallow source and drain diffusion layers, silicide often appears after being downwardly thrust through the diffusion layers. As a result, leakage occurs between the source and drain diffusion layers and the substrate.

As a countermeasure, the Elevated Source-Drain technique has been developed. This is a technique that forms a silicide layer by depositing a metal on a silicon single-crystal layer selectively formed on the source and drain regions. Since the silicon of the silicon single-crystal layer interacts with the metal and forms the suicide, the silicide does not excessively erode the source or drain diffusion layers. Therefore, it was expected that the downward penetration of the silicide through the source or drain diffusion layer was prevented.

In the Elevated Source-Drain technique, silicon is epitaxially grown on the source and drain diffusion layers, which are limited regions of the entire surface of the semiconductor substrate. In order to obtain a sufficiently thick silicon single-crystal layer by the epitaxial growth process, the vapor-phase epitaxy (VPE) technique needs annealing at a high temperature not lower than 800° C.

Such high-temperature annealing, however, causes thermal diffusion of impurities in the source and drain diffusion layers. In the epitaxial growth process, excessive diffusion of these diffusion layers may invite the short-channeling effect in miniaturized MOS transistors. Therefore, high-temperature annealing of semiconductor substrates is not desirable after sources and drains are formed.

Apart from this, there is the Solid Phase Epitaxy (SPE) technique that first deposits amorphous silicon on a semiconductor substrate and thereafter anneals it at approximately 600° C. to change the silicon to single crystal. Even with the Solid Phase Epitaxy, a silicon single-crystal layer can be formed on source and drain diffusion layers. When annealing is carried out at a relatively low temperature around 600° C., thermal diffusion of source and drain diffusion layers is immaterial.

However, even in Solid Phase Epitaxy, if a silicon oxide exists on the semiconductor substrate, amorphous silicon deposited on the silicon oxide sometimes fails to change to single crystal. In this case, amorphous silicon on the source and drain diffusion layers can change to single crystal only partly and insufficiently for use in the Elevated Source-Drain technique. As a result, in a step of selectively etching the amorphous silicon deposited on the top surface of the semiconductor substrate, the silicon having failed to change to single crystal on source and drain regions is undesirably etched simultaneously. Therefore, this technique could not make the best use of the Elevated Source-Drain technique.

Especially when the semiconductor substrate is a p-type substrate containing an impurity such as boron, because it is easily oxidized, amorphous silicon deposited on the top surface of the p-type semiconductor substrate containing boron, or the like, is difficult to single-crystallize sufficiently.

These and other problems involved in the conventional techniques are discussed below with reference to the drawings.

FIGS. 20 through 24 are cross-sectional views that show a semiconductor substrate in an enlarged form to demonstrate a conventional method of manufacturing a semiconductor device in the order of its procedures.

As shown in FIG. 20, an isolating region 30 is formed in the semiconductor substrate 10. The substrate 10 has formed a gate insulating film 40 on its top surface and a gate electrode 60 on the gate insulating film 40. A sidewall protective layer 85 is formed on the sidewall of the gate electrode. The semiconductor substrate 10 further includes diffusion layers 70, 72 as source and drain layers.

The top surface of the semiconductor substrate 10 in the regions of the diffusion layers 70, 72 are exposed to epitaxially grow a silicon single-crystal layer thereon. However, the top surface of the semiconductor substrate 10 is oxidized when contacting air, and a silicon oxide 90 is produced on the top surface of the semiconductor substrate.

As shown in FIG. 21, an amorphous silicon layer 100 is deposited on the top surface of the semiconductor substrate and on the gate electrode 60.

As shown in FIG. 22, the amorphous silicon layer 100 is annealed. However, the silicon oxide 90 exists between the top surface of the semiconductor substrate 10 and the amorphous silicon layer 100, and locally prevents the amorphous silicon layer 90 from direct contact with the top surface of the semiconductor substrate 10. Since the amorphous silicon layer 100 can epitaxially grow only along the crystal on the top surface of the semiconductor substrate 10, part of the amorphous silicon layer 100 not contacting the top surface of the semiconductor substrate 10 cannot grow epitaxially even when it is annealed. As a result, the silicon single-crystal layer 120 transformed from the amorphous silicon layer 100 by annealing does not become uniform in thickness and quality on the top surface of the semiconductor substrate 10.

As shown in FIG. 23, as a result of etching by making use of the difference in etching rate between the silicon single-crystal layer and the amorphous or polycrystalline silicon, the amorphous silicon 100 and the polycrystalline silicon transformed from the amorphous silicon 100 are etched, and the silicon single-crystal layer 120 remains.

As shown in FIG. 24, a metal acts on the silicon deposited on the semiconductor substrate 10, as a result, a silicide layer 130 is formed. In regions where the silicon single-crystal layer 120 is thin, the deposited metal acts not only on the silicon of the silicon single-crystal layer 120 but also on the silicon of the diffusion layers 70, 72. Therefore, the diffusion layers 70, 72 are excessively encroached by the silicide layer 130, which may grow even beyond the diffusion layers 70, 72. Thus, the advantage of the Elevated Source-Drain technique is not harnessed sufficiently.

Here is needed a semiconductor device manufacturing method capable of forming a silicon single-crystal layer acceptable for use with the Elevated Source-Drain technique on source and drain diffusion layers at a relatively low temperature.

Additionally needed is a semiconductor device having a silicide layer formed by the Elevated Source-Drain technique and uniform in thickness and quality, keeping the contact resistance low between the source and drain diffusion layers on one part and source and drain electrodes on the other part, and available for more progressed microminiaturization than a conventional one.

BRIEF SUMMARY OF THE INVENTION

A semiconductor device according to an embodiment of the invention comprises: a semiconductor substrate; a gate insulating film formed on the top surface of the semiconductor substrate; a gate electrode formed on the gate insulating film; diffusion layers formed in the semiconductor substrate to be used a source layer and a drain layer; and a silicide layer formed to overlie the diffusion layers;

wherein an oxygen concentration peak, where oxygen concentration is maximized, is at a level lower than said top surface in a cross-section taken along a plane perpendicular to said top surface.

A method of manufacturing a semiconductor device according to an embodiment of the invention comprises: forming a gate insulating film on the top surface of a semiconductor substrate; forming a gate electrode on the gate insulating film; forming diffusion layers in a self-aligned manner in the semiconductor substrate on opposite sides of the gate electrode; forming an amorphous layer on the top surface of the semiconductor substrate above the diffusion layers; implanting ions of an injection substance into the semiconductor substrate through an interface thereof with the amorphous layer; annealing the semiconductor substrate at a relatively low temperature to partly change the amorphous layer to a single-crystal layer; and sputtering a metal onto the single-crystal layer and thereby forming a silicide layer from the single crystal and the metal.

DETAILED DESCRIPTION OF THE INVENTION

Figure 1:
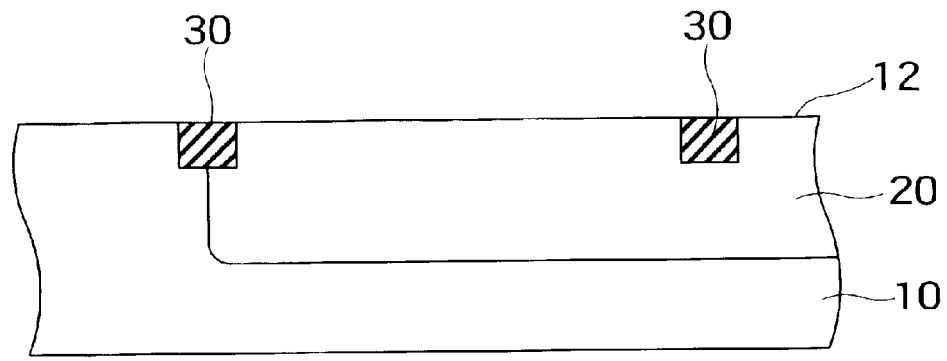
FIG. 1 is an enlarged cross-sectional view of a semiconductor substrate under a process of a semiconductor device manufacturing method according to the first embodiment of the invention.

Some embodiments of the invention will now be explained below with reference to the drawings. However, these embodiments should not be construed to limit the invention, and respective components shown in the drawings may not accord with their scale.

FIGS. 1 through 10 are enlarged cross-sectional views of a semiconductor substrate for sequentially showing a semiconductor device manufacturing method according to the first embodiment of the invention. In this embodiment, a p-type MOS transistor is manufactured.

As shown in FIG. 1, an n-type well region 20 is formed by introducing arsenic, phosphorus or other impurity into a semiconductor substrate 10 and annealing it. In this embodiment, the depth of the n-type well region 20 from the top surface 12 of the semiconductor substrate 10 is about 1 $\mu$m.

After that, an isolation 30 is formed by burying an oxide in a predetermined region. In this embodiment, the isolation 30 is made by the STI (shallow trench isolation) technique. The depth of the isolation 30 from the top surface 12 of the semiconductor substrate 10 is about 400 nm.

Figure 2:
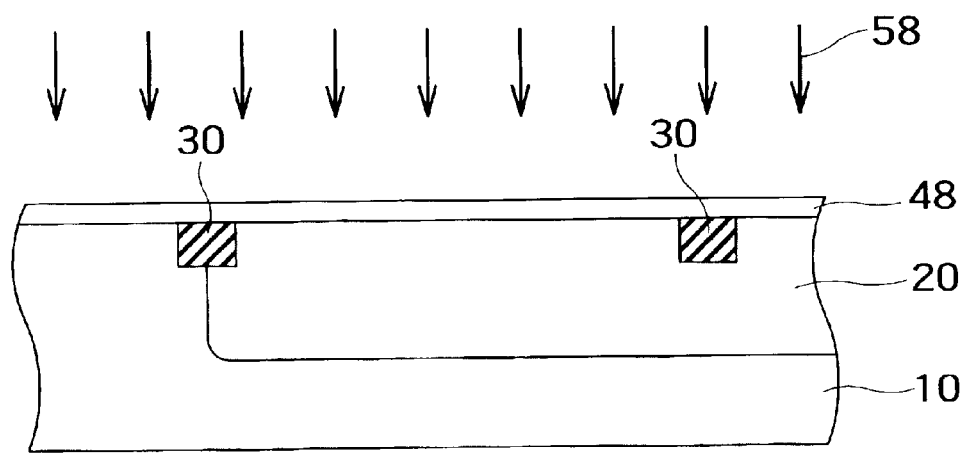
FIG. 2 is an enlarged cross-sectional view of the semiconductor substrate under a process continuous from FIG. 1 in the semiconductor device manufacturing method according to the first embodiment.

As shown in FIG. 2, a substrate protective oxide film 48 is next formed on the top surface 12 of the semiconductor substrate 10. The substrate protective oxide film 48 is used to protect the substrate 10 against the impulse of subsequent channel-ion injection 58. In this embodiment, the thickness of the substrate protective oxide film 48 is about 10 nm. Thereafter, channel-ion injection 58 is carried out to adjust the threshold voltage of the MOS transistor.

Figure 3:
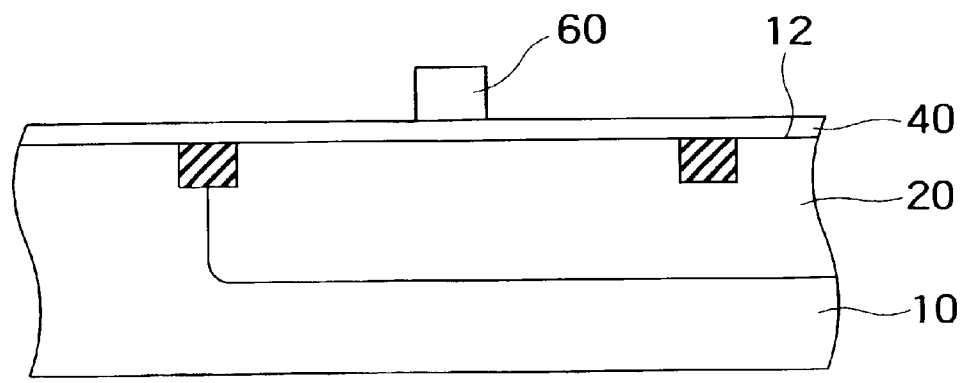
FIG. 3 is an enlarged cross-sectional view of the semiconductor substrate under a process continuous from FIG. 2 in the semiconductor device manufacturing method according to the first embodiment.

As shown in FIG. 3, after the substrate protective oxide film 48 is next removed, a gate insulating film 40 is formed on the top surface 12 of the semiconductor substrate 10. The thickness of the gate insulating film 40 is approximately several nanometers. The gate insulating film 40 may be a silicon oxide film, but also usable is an oxynitride film made by introducing several % of nitrogen into a silicon oxide film, an high dielectric constant such as $TaO_2$, $ZrO_x$, $HfO_x$ (where x is a positive integer), or any of their silicate film.

After that, polycrystalline silicon is deposited on the gate insulating film 40 by CVD (chemical vapor deposition), for example. Thereafter, a gate electrode 60 is formed by patterning the deposited polycrystalline silicon by photolithography. In the instant embodiment, the thickness of the gate electrode 60 is around 150 nm.

Figure 4:
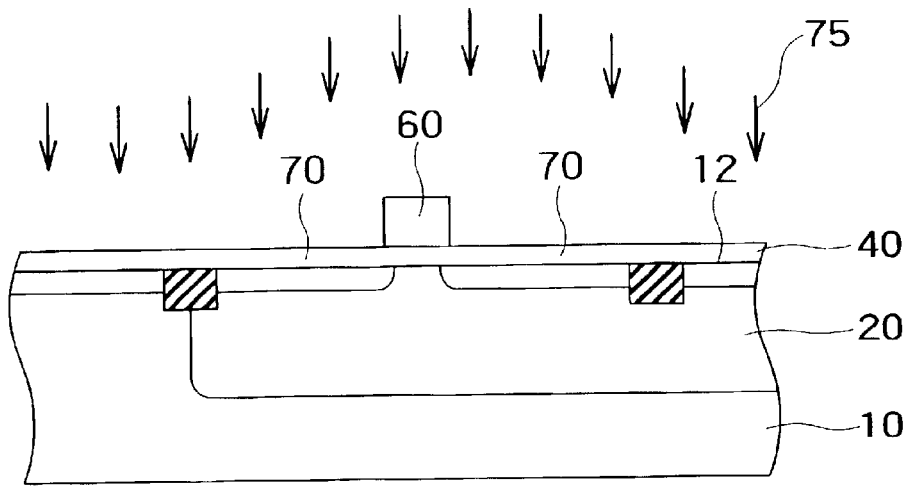
FIG. 4 is an enlarged cross-sectional view of the semiconductor substrate under a process continuous from FIG. 3 in the semiconductor device manufacturing method according to the first embodiment.

As shown in FIG. 4, ion injection 75 is next carried out to form a diffusion layer 70. The diffusion layer 70 is formed in a self-aligned manner in opposite sides of the gate electrode 60 by introducing ions to the top surface 10 of the semiconductor substrate 10 through the gate insulating film 40.

The diffusion layer 70 is used as a source layer or a drain layer, and may be used as a part of a LDD (lightly doped drain) structure. In the instant embodiment, the diffusion layer 70 is used as an extension layer for making the LDD structure doubling the source or drain layer. By using the source or drain layer of the LDD structure, generation of hot electrons and a short-channel effect can be prevented.

In the instant embodiment, the impurity used for extension ion injection 75 may be boron, for example. The dose of boron may be approximately $5 \times 10^{14}$ cm$^{-2}$, for example, and the injection energy is approximately 10 keV, for example. Therefore, the diffusion layer 70 has a p-type conductivity. The depth of the diffusion layer from the top surface 12 is around 40 nm.

Thereafter, a silicon oxide film is deposited to cover the top surface 12 and the gate electrode 60, and a silicon nitride film is deposited thereon. Both the silicon oxide film and the silicon nitride film may be deposited by LP-CVD, for example. The silicon oxide film is used as a liner layer having the role of stopping etching when the silicon nitride film is etched.

Figure 5:
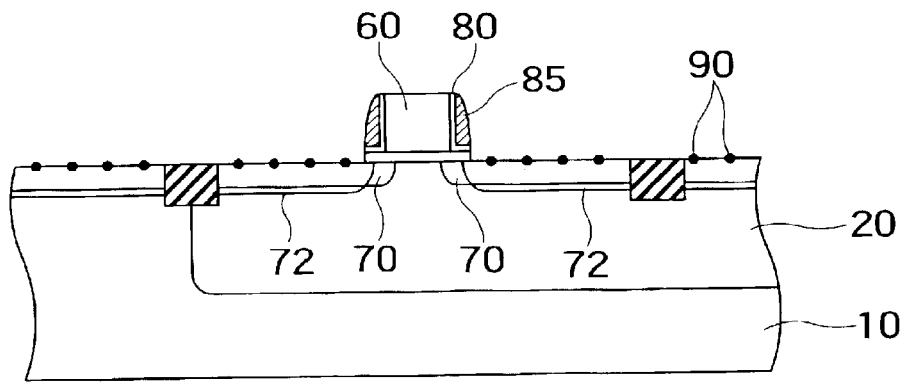
FIG. 5 is an enlarged cross-sectional view of the semiconductor substrate under a process continuous from FIG. 4 in the semiconductor device manufacturing method according to the first embodiment.

As shown in FIG. 5, the silicon nitride film and the silicon oxide film are selectively removed by anisotropic etching, and they partly remain as a sidewall liner layer 80 and a sidewall protective layer 85 on the sidewall of the gate electrode 60. The sidewall liner layer 80 and the sidewall protective layer 85 are approximately 5 nm thick and 20 nm thick, respectively, for example.

The sidewall liner layer 80 and the sidewall protective layer 85 protect the sidewall of the gate electrode 60, and also function as a spacer during ion injection for forming source and drain diffusion layer 72. That is, the sidewall protective layer 85 makes the source and drain layer 72 implanted in a self-aligned manner. Thereby, the diffusion layers 70, 72 form a LDD structure. In the instant embodiment, depth of the diffusion layer 72 is approximately 50 nm.

After the silicon oxide film and the silicon nitride film are removed, the diffusion layer 70 or 72 on the top surface of the semiconductor substrate 10 is exposed. The crystal surface of the top surface 12 of the semiconductor substrate 10 assists epitaxial growth of a silicon single-crystal layer on the top surface 12.

On the other hand, exposure of the crystal surface of the top surface 12 of the semiconductor substrate 10 to air causes a silicon oxide 90 to be produced by oxidation of silicon on the top surface.

Figure 6:
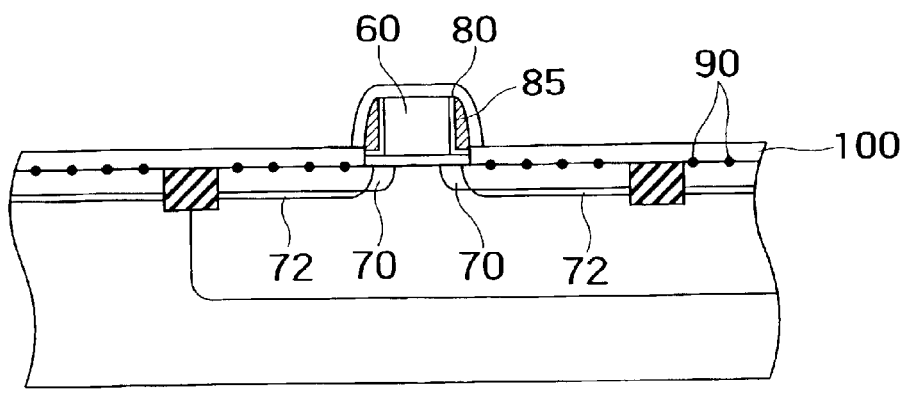
FIG. 6 is an enlarged cross-sectional view of the semiconductor substrate under a process continuous from FIG. 5 in the semiconductor device manufacturing method according to the first embodiment.

As shown in FIG. 6, an amorphous silicon layer 100 is then deposited over the exposed top surface 12 and the gate electrode 60. The amorphous silicon 100 is formed by LP-CVD, for example, using silane ($SiH_4$) in an atmosphere held at approximately 600° C. In the instant embodiment, the thickness of the amorphous silicon is about 50 nm.

Figure 7:
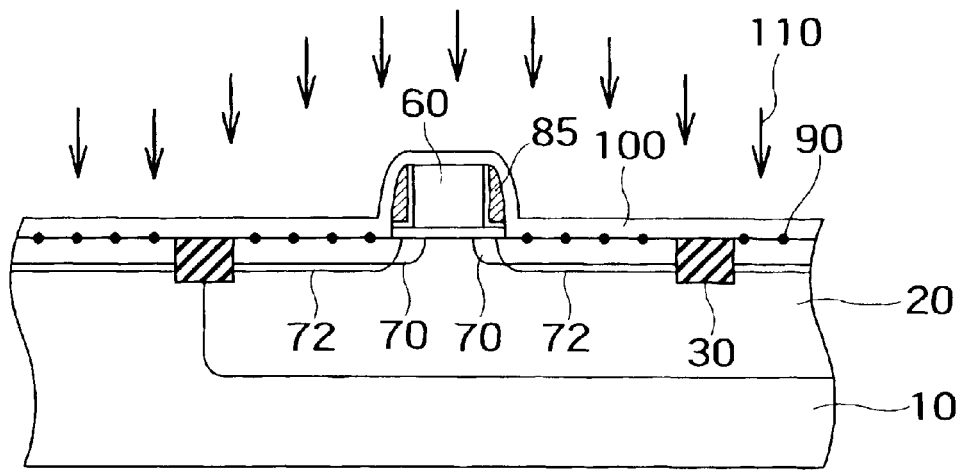
FIG. 7 is an enlarged cross-sectional view of the semiconductor substrate under a process continuous from FIG. 6 in the semiconductor device manufacturing method according to the first embodiment.

As shown in FIG. 7, ions are injected into the semiconductor substrate 10 through its interface with the amorphous silicon 100. Injection material for this ion injection 110 may be, for example, germanium, arsenic, boron, argon, which is an inactive substance, or any of their congener elements. In the instant embodiment, germanium is used as the injection material for the ion injection 110. The quantity of the injection material for the ion injection 110 may be, for example, approximately $1 \times 10^{15}$ cm$^{-2}$, and the injection energy is about 7 keV, for example.

Germanium ions accelerated by the ion injection 110 break through to the silicon oxide 90 through the amorphous silicon layer 100, and push oxygen contained in the silicon oxide 90 from the interface between the semiconductor substrate 10 and the amorphous silicon layer 100 to below the top surface 12 of the semiconductor substrate 10. That is, injected germanium ions knock against interfacial oxygen existing along the interface between the semiconductor substrate 10 and the amorphous silicon layer 100, pushing it below the top surface 12.

The dose of germanium is determined by the quantity of the silicon oxide 90 or interfacial oxygen. The quantity of the silicon oxide 90 or interfacial oxygen depends on various conditions upon exposing the top surface 12 of the semiconductor substrate 10 to air, such as, the duration of time of exposure of the top surface 12 to air, the temperature, the oxygen concentration in the ambient air, and so on. Normally, these conditions are maintained constant throughout the manufacturing process of the semiconductor device. Therefore, the dose of germanium may be determined in accordance with the conditions in the manufacturing process of the semiconductor device.

In the instant embodiment, the quantity of interfacial oxygen between the semiconductor substrate 10 and the amorphous silicon layer 100 is deemed to be about $1 \times 10^{15}$ cm$^{-2}$. Thus the dose of germanium is $1 \times 10^{15}$ cm$^{-2}$, equal to the quantity of the interfacial oxygen. For the purpose of reliably knocking more interfacial oxygen below the top surface 12, the dose of germanium is preferably equal to or more than the interfacial oxygen existing along the interface between the semiconductor substrate 10 and the amorphous silicon layer 100.

In contrast, for the purpose of preventing the semiconductor substrate 10 from excessive damage, the dose of germanium may be less than the quantity of the interfacial oxygen.

Injection energy of germanium must be large enough for germanium to penetrate the amorphous silicon layer 100. On the other hand, germanium and oxygen may cause a leakage at the junction between the diffusion layer 72 and the well region 20 if they are injected or knocked deeper than the depth of the diffusion layer 72. Therefore, injection energy of germanium is preferably limited to a level prohibiting germanium from penetrating the diffusion layer 72.

In the instant embodiment, germanium or oxygen is preferably injected or knocked shallower than the depth of the diffusion layer 72. However, in case the device does not include the diffusion layer 72 as the source and drain layer and only includes the diffusion layer 70 as the extension layer, germanium and oxygen are preferably injected or knocked shallower than the depth of the diffusion layer 70. In this case, since the diffusion is shallower than the diffusion layer 72, injection energy of germanium is adjusted to be lower than the injection energy used in this embodiment.

Figure 8:
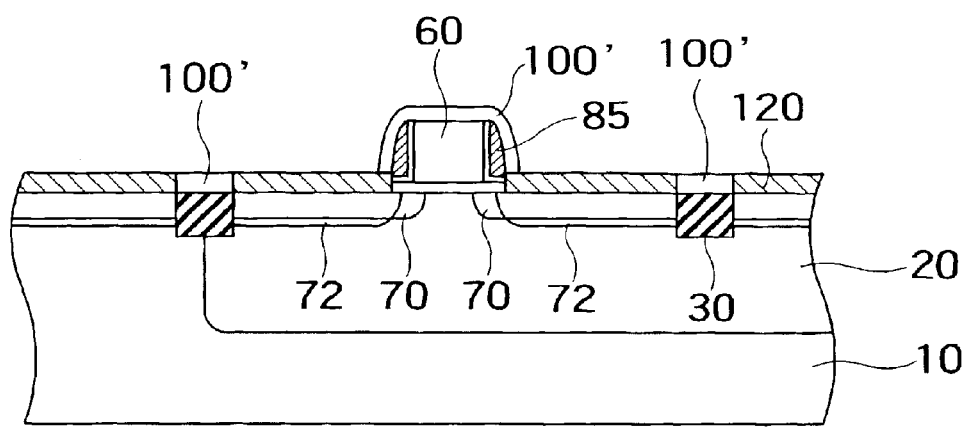
FIG. 8 is an enlarged cross-sectional view of the semiconductor substrate under a process continuous from FIG. 7 in the semiconductor device manufacturing method according to the first embodiment.

As shown in FIG. 8, the amorphous silicon layer 100 is annealed. As a result of this annealing, the amorphous silicon layer 100 on the diffusion layers 70, 72 is epitaxially grown to form a silicon single-crystal layer 120. That is, in the instant embodiment, to obtain the silicon single-crystal layer 120, the SPE technique is used. In the instant embodiment, the annealing is carried out in a hydrogen atmosphere held at approximately 600° C. in an LP-CVD apparatus.

At the time of annealing, interfacial oxygen is already knocked below the top surface of the semiconductor substrate 10, and the silicon oxide 90 no longer exists between the semiconductor substrate 10 and the amorphous silicon layer 100. Therefore, the entirety of the amorphous silicon layer 100 is in contact with silicon crystals on the top surface 12 of the source and drain diffusion layers 70, 72. As a result, the amorphous silicon layer 100 can epitaxially grow with sufficient thickness and uniform quality on the diffusion layers 70, 72 and can change to the silicon single-crystal layer 120.

On the other hand, top surfaces of the device-isolating portion 30, gate electrode 60 and sidewall protective layer 85 are made of a silicon oxide, polycrystalline silicon and silicon nitride, respectively. Therefore, the amorphous silicon layer 100 does not epitaxially grow on the device-isolating portion 30, gate electrode and sidewall protective layer 85, and remains as the amorphous silicon layer or changes to a polycrystalline silicon layer.

Figure 9:
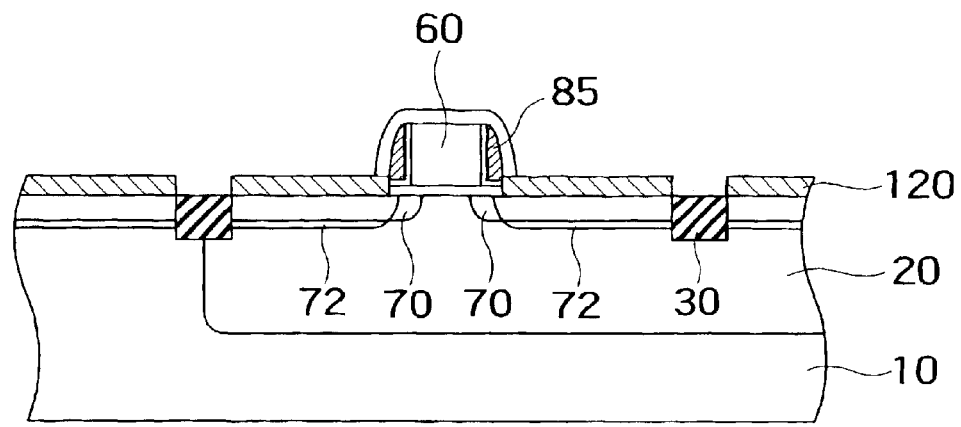
FIG. 9 is an enlarged cross-sectional view of the semiconductor substrate under a process continuous from FIG. 8 in the semiconductor device manufacturing method according to the first embodiment.

As shown in FIG. 9, the layer 100' of amorphous silicon and polycrystalline silicon is selectively etched relative to the silicon single-crystal layer 120. In this embodiment, this etching is carried out by LP-CVD using chlorine gas diluted to approximately 10% by hydrogen within the same chamber as that used for deposition of the amorphous silicon layer 100. Etching selectivity of amorphous silicon relative to single-crystal silicon is 10 or more.

In the instant embodiment, a common chamber is used both for epitaxial growth of the silicon single-crystal layer 120 and for selective etching of the amorphous silicon layer and the polycrystalline silicon layer 100'. This contributes to shortening the manufacturing process of the semiconductor device, enhancing the productivity and reducing the manufacturing cost. Additionally, the quality of the silicon single-crystal layer 120 is improved.

Even when different chambers are used for those steps, substantially the same effect is obtained by using a so-called cluster tool and carrying out a series of epitaxial growth, selective etching, and so on.

When the amorphous silicon layer and the polycrystalline silicon layer 100' are selectively etched, the sidewall of the gate electrode 60 is protected by the sidewall liner layer 80 and the sidewall protective layer 85. Therefore, the sidewall of the gate electrode 60 is not etched. The top surface of the gate electrode 60 is in direct contact with the polycrystalline silicon layer 100'. Since the gate electrode 60 is made of polycrystalline silicon which is same as the polycrystalline layer 100', it is immaterial that the polycrystalline layer 100' is not removed completely but partly remains. On the other hand, since the gate electrode 60 is sufficiently thick relative to the amorphous silicon layer and the polycrystalline silicon layer 100', it is acceptable that the top surface of the gate electrode 60 is over-etched slightly.

Figure 10:
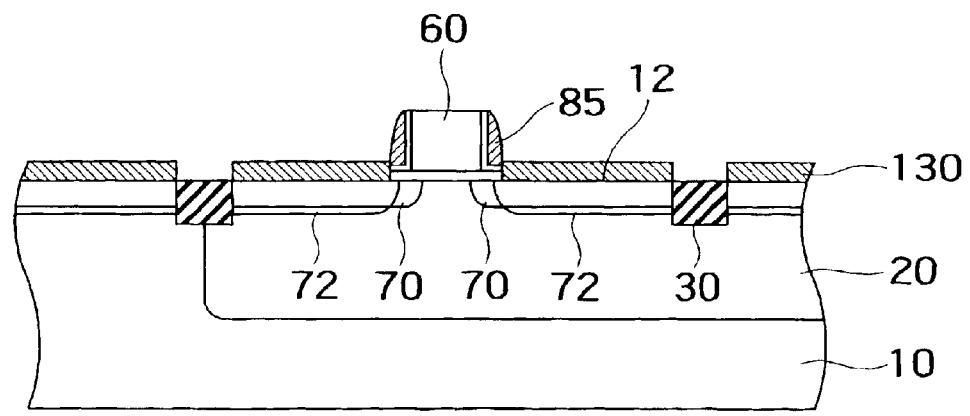
FIG. 10 is an enlarged cross-sectional view of the semiconductor substrate under a process continuous from FIG. 9 in the semiconductor device manufacturing method according to the first embodiment.

As shown in FIG. 10, a metal is next deposited on the silicon single-crystal layer 120. This metal may be, for example, cobalt, nickel, titanium, or the like. The deposited metal acts on silicon of the silicon single-crystal layer 120 and forms a silicide layer 130 used for reducing the contact resistance.

Since the metal interacts with silicon of the silicon single-crystal layer 120, it does not erode silicon in the diffusion layers 70, 72 underlying the top surface 12 of the semiconductor substrate 10. Even if the metal erodes the diffusion layers 70, 72, the quantity of the eroded silicon in the diffusion layers 70, 72 is quite small. Therefore, the silicide layer 130 does not protrude through the bottom of the diffusion layers 70, 72. Thus leakage does not occur between the source and drain diffusion layers 70, 72 and the substrate 10 or well region 20. That is, this embodiment can attain sufficient effects of the Elevated Source-Drain technique.

Through some subsequent steps (not shown), including the step of forming a contact and a step of forming a interconnections, the semiconductor device according to the instant embodiment is completed.

As explained above, the semiconductor device manufacturing method according to this embodiment does not anneal the semiconductor substrate 10 at 600° C. or higher temperatures after forming the diffusion layers 70, 72. Therefore, the embodiment can form the diffusion layers 70, 72 relatively shallow from the top surface 12 of the semiconductor substrate 10, and can prevent punch-through or other short channel effect even when the semiconductor substrate is downsized extremely.

Next explained is the configuration of the semiconductor substrate 200 made by the manufacturing method according to the first embodiment.

Figure 11A:
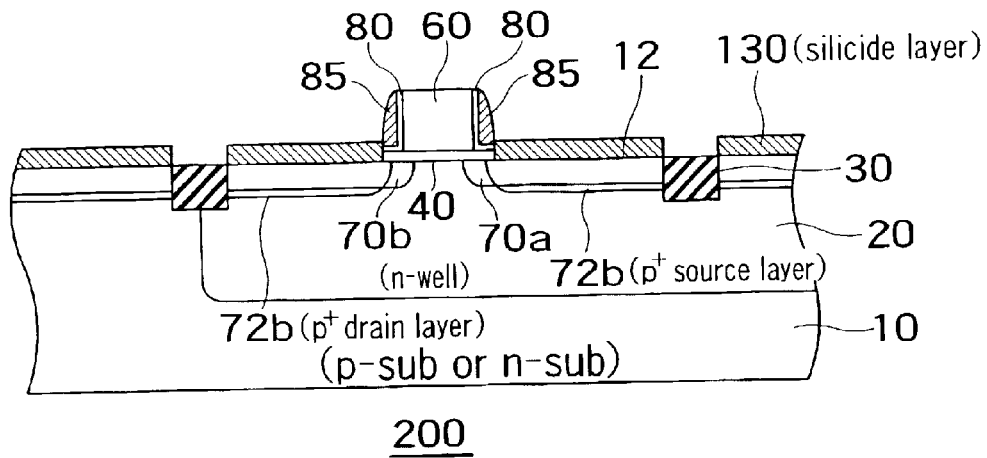
FIG. 11A is an enlarged cross-sectional view of a semiconductor device 200 manufactured by a semiconductor device manufacturing method according to the first embodiment.

FIG. 11A is an enlarged cross-sectional view of the semiconductor device 200 manufactured by the semiconductor device manufacturing method according to the first embodiment. The semiconductor device 200 according to this embodiment includes the semiconductor substrate 10; gate insulating film 40 formed on the top surface 12 of the semiconductor substrate 10; and gate electrode 60 formed on the gate insulating film 40. In a part of the semiconductor substrate 10 on one side of the gate electrode 60, the source-side extension layer 70a connected to the source electrode (not shown) is formed in a self-aligned manner making use of the sidewall of the gate electrode 60. Similarly, in another part of the semiconductor substrate 10 on the other side of the gate electrode 60, the drain-side extension layer 70b connected to the drain electrode (not shown) is formed in a self-aligned manner making use of the sidewall of the gate electrode 60.

On the gate electrode 60, the sidewall protective layer 85 lies via the liner layer 80 to protect the gate electrode 60. In a region of the semiconductor substrate on one side of the gate electrode 60, the source layer 72a is formed in a self-aligned manner using the sidewall protective layer 85 as a spacer. Similarly, in another region of the semiconductor substrate 10 on the other part of the gate electrode 60, the drain layer 72b is formed in a self-aligned manner using the sidewall protective layer 85 as a spacer.

The instant embodiment includes both the source-side extension layer 70a plus the drain-side extension layer 70b (hereinbelow collectively called diffusion layer 70 as well) and the source layer 72a plus the drain layer 72b (hereinbelow collectively called diffusion layer 72 as well). However, even when the semiconductor device has only one of diffusion layer 70 or 72, the effects of the embodiment of the invention will be maintained.

The semiconductor device 200 further includes a silicide layer 130 overlying the diffusion layer 70 or 72. The silicide layer 130 is preferably connected directly to the diffusion layers 70, 72 to reduce the contact resistance between the diffusion layers 70, 72 and the source or drain electrode.

However, for the purpose of completely preventing silicon in the diffusion layers 70, 72 from erosion in the process of forming the silicide layer 130, a silicon single-crystal layer 120 may reside between the silicide layer 130 and the diffusion layers 70, 72. In this case, the silicon single-crystal layer interposed between the silicide layer 130 and the diffusion layers 70, 72 are doped with an impurity.

Figure 11B:
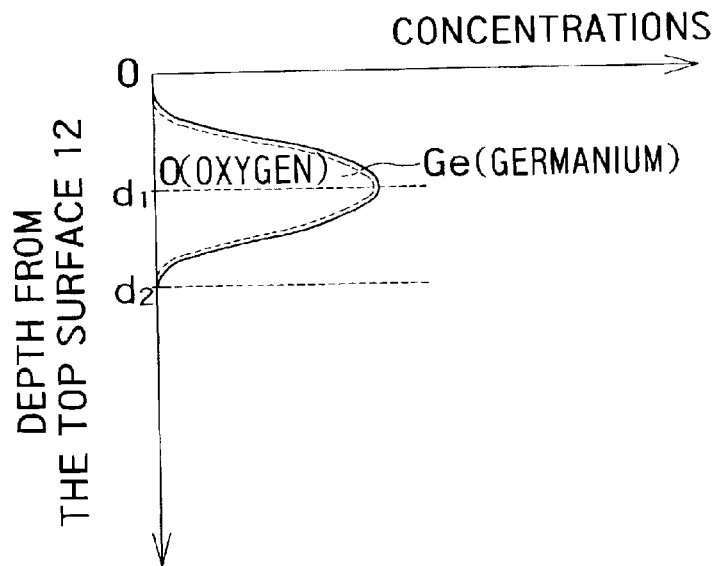
FIG. 11B is a graph showing changes of oxygen and germanium concentrations with depth from the top surface 12 of the semiconductor device 200.

FIG. 11B is a graph showing changes of oxygen and germanium concentrations with depth from the top surface 12 of the semiconductor device 200. Let the depth of the top surface 12 be 0 (zero). Then the depth of the oxygen concentration peak, where the oxygen concentration is maximized, and the depth of the germanium concentration peak, where the germanium concentration is maximized, is denoted by $d_1$, and the depth of the diffusion layer 72 is denoted by $d_2$.

According to the graph of FIG. 11B, the oxygen concentration peak and the germanium concentration peak are in a level lower than the top surface 12. Germanium and interfacial oxygen are injected or knocked to substantially the same depth $d_1$ from the top surface 12. Therefore, the depth of the oxygen concentration peak from the top surface 12 of the semiconductor device 10 is approximately equal to the depth of the germanium concentration peak from the top surface 12 of the semiconductor substrate 10.

Energy for injection of germanium is adjusted to prohibit germanium and oxygen from penetrating the diffusion layer 72 and reaching the n well 20. Therefore, according to the instant embodiment, both the depth $d_1$ of the oxygen concentration peak and the depth $d_1$ of the germanium concentration peak are shallower than the depth $d_2$ of the diffusion layer 72.

As explained above, the dose of germanium is determined by the quantity of interfacial oxygen. If a larger quantity of germanium than interfacial oxygen is injected, then the concentration of germanium contained in each unit surface area of the semiconductor substrate 10 is equal to or larger than the concentration of oxygen contained in each unit surface area of the semiconductor substrate 10. That is, the value of the germanium concentration peak is equal to or larger than the value of the oxygen concentration peak.

In the instant embodiment, the dose of germanium is substantially equal to the quantity of interfacial oxygen. Therefore, In FIG. 11B, the peak value of germanium concentration is approximately equal to the peak value of oxygen concentration. As a result, germanium can knock substantially all interfacial oxygen without damaging the top surface 12 excessively.

The oxygen concentration being substantially zero on the top surface 12 demonstrates that the silicon oxide does not exist on the top surface 12. Therefore, the silicon single-crystal layer grows with a sufficient thickness and uniform quality on the diffusion layers 70, 72. The sufficiently thick and uniform-quality silicon single-crystal layer contributes to forming a sufficiently thick and uniform silicide layer 130 without eroding silicon in the diffusion layers 70, 72 excessively.

In case the semiconductor device 200 is downsized, it needs diffusion layers 70, 72 higher in impurity concentration and shallower in structure. In such a case, the instant embodiment can fabricate a silicide layer 130 that maintains a low contact resistance without eroding the shallow diffusion layers 70, 72.

Thus the semiconductor device according to the embodiment can overcome the short-channel effect, an increase of the contact resistance and other problems caused by microminiaturization.

FIGS. 12 through 19 are enlarged cross-sectional views of a semiconductor substrate under different, sequential processes of a semiconductor device manufacturing method according to the second embodiment of the invention. The same components as those of the semiconductor substrate according to the first embodiment are labeled with the same reference numerals.

The second embodiment has a difference from the first embodiment in forming a top surface protective layer 88 on the top surface of the gate electrode 60 (FIGS. 13 through 19).

Figure 12:
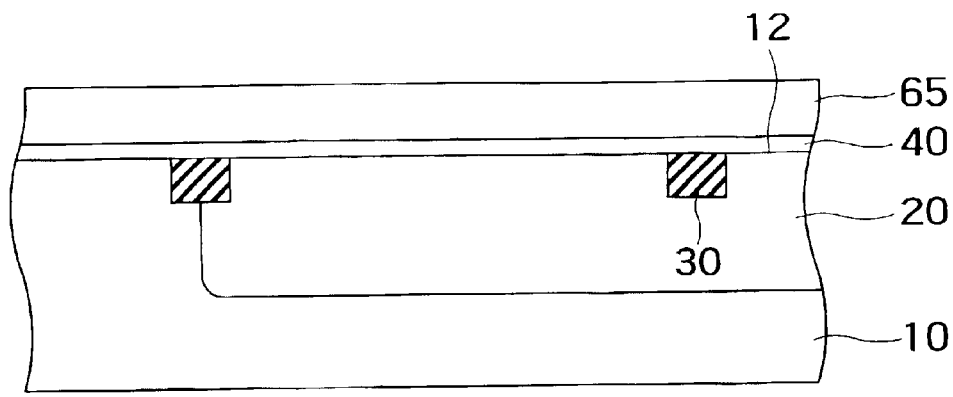
FIG. 12 is an enlarged cross-sectional view of a semiconductor substrate under a process of a semiconductor device manufacturing method according to the second embodiment of the invention.

As shown in FIG. 12, the n-well region 20, device-isolating portion 30 and gate insulating film 40 are formed in the same manner as the first embodiment, and a polycrystalline silicon layer 65 is formed on the gate insulating film 40.

Figure 13:
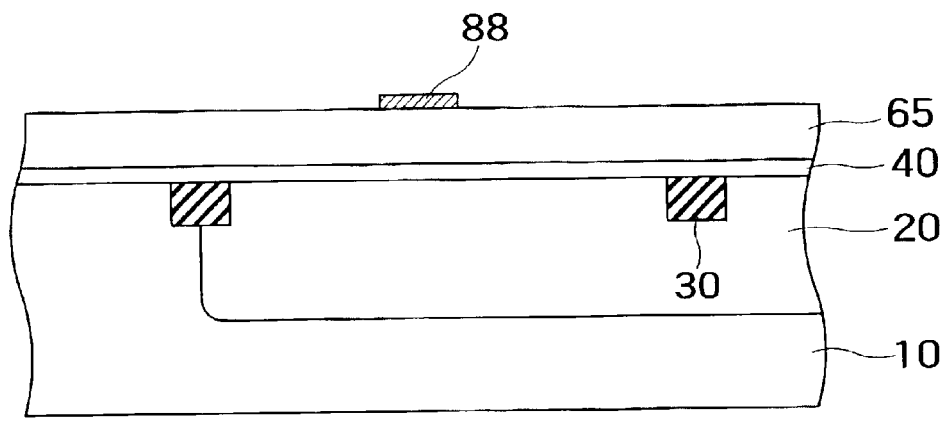
FIG. 13 is an enlarged cross-sectional view of the semiconductor substrate under a process continuous from FIG. 12 in the semiconductor device manufacturing method according to the second embodiment.

As shown in FIG. 13, a silicon nitride film 88 is next formed by depositing a silicon nitride and next patterning it by using photolithography. In the instant embodiment, the thickness of the silicon nitride film 88 is approximately 50 nm.

Figure 14:
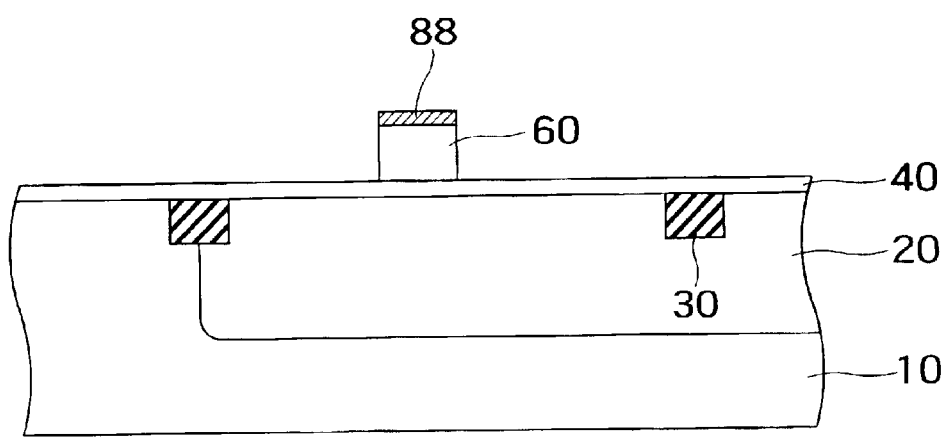
FIG. 14 is an enlarged cross-sectional view of the semiconductor substrate under a process continuous from FIG. 13 in the semiconductor device manufacturing method according to the second embodiment.

As shown in FIG. 14, next using the silicon nitride film 88 as a mask, the polycrystalline silicon layer 65 is etched to form the gate electrode.

Figure 15:
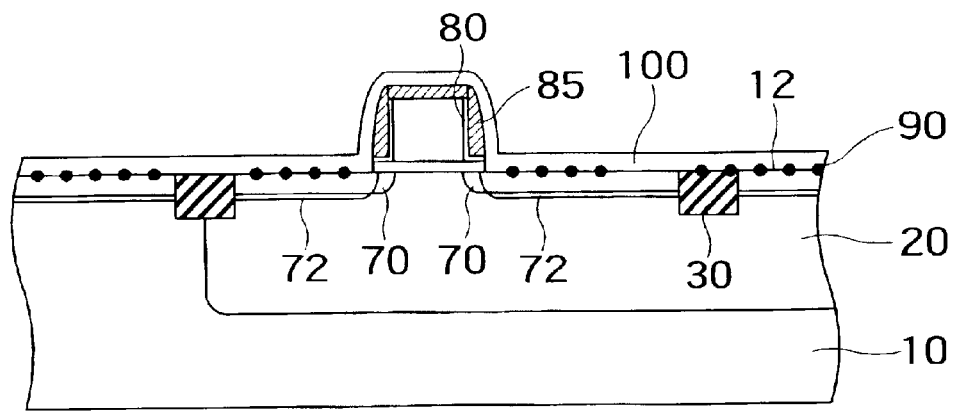
FIG. 15 is an enlarged cross-sectional view of the semiconductor substrate under a process continuous from FIG. 14 in the semiconductor device manufacturing method according to the second embodiment.

As shown in FIG. 15, the liner layer 80, sidewall protective layer 85 and diffusion layers 70, 72 are formed in the same manner as the first embodiment. Additionally, the amorphous silicon layer 100 is formed on the top surface 12 of the silicon substrate 10 and the gate electrode 60. Here again, the silicon oxide 90 is produced between the top surface 12 and the amorphous silicon layer 100.

Figure 16:
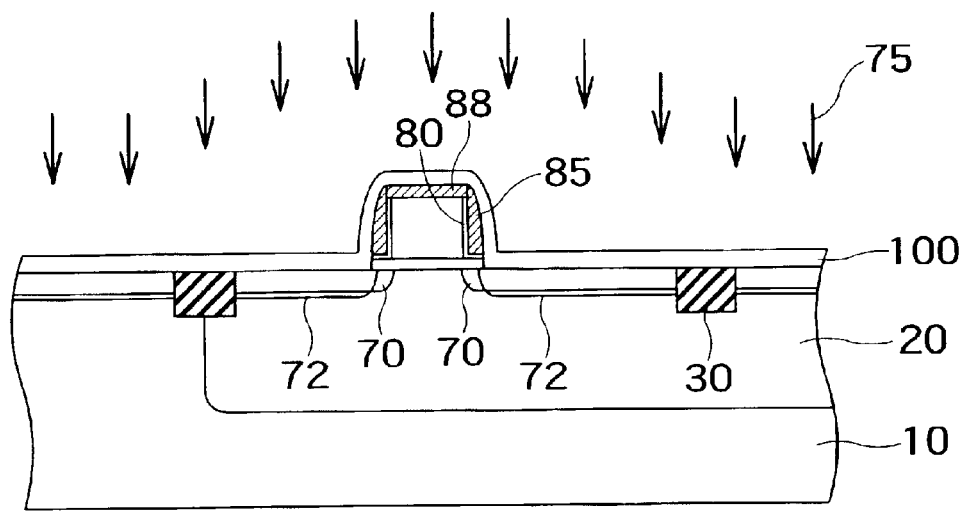
FIG. 16 is an enlarged cross-sectional view of the semiconductor substrate under a process continuous from FIG. 15 in the semiconductor device manufacturing method according to the second embodiment.

As shown in FIG. 16, germanium ions are next injected into the semiconductor substrate through its interface with the amorphous silicon 100. Thereby, interfacial oxygen is knocked downward of the top surface 12 of the semiconductor substrate 10.

Figure 17:
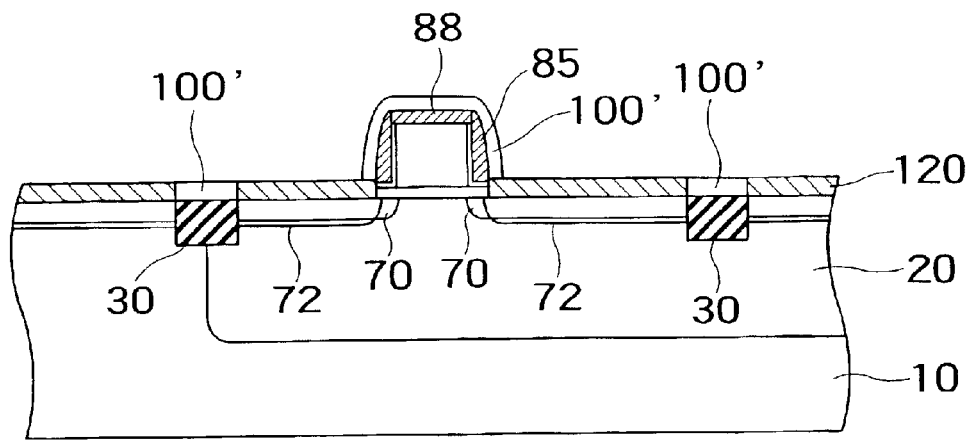
FIG. 17 is an enlarged cross-sectional view of the semiconductor substrate under a process continuous from FIG. 16 in the semiconductor device manufacturing method according to the second embodiment.

As shown in FIG. 17, the semiconductor substrate 10 is annealed at a temperature around 600° C. Since the interfacial oxygen is already knocked below the top surface of the semiconductor substrate 10, the amorphous silicon layer 100 can change to the silicon single-crystal layer with sufficient thickness and uniform quality on the diffusion layers 70, 72.

On the other hand, the amorphous silicon layer 100 does not epitaxially grow on the device-isolating portion 30, sidewall protective layer 85 and top surface protective layer 88, and it remains in the amorphous phase, or changes to a polycrystalline silicon layer.

Figure 18:
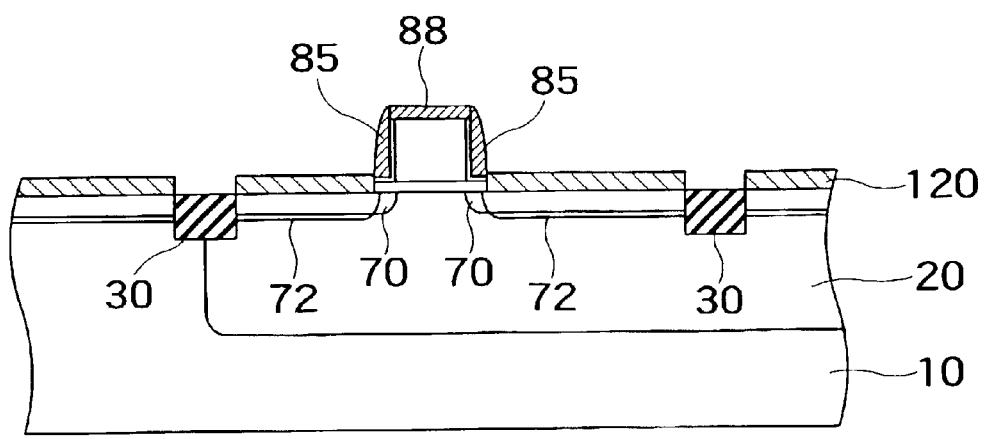
FIG. 18 is an enlarged cross-sectional view of the semiconductor substrate under a process continuous from FIG. 17 in the semiconductor device manufacturing method according to the second embodiment.

As shown in FIG. 18, the amorphous silicon layer or polycrystalline silicon layer 100' is next etched selectively relative to the silicon single-crystal layer 120.

In this embodiment, the top surface protective layer 88 prevents the gate electrode 60 from being etched. That is, the top surface protective layer 88 functions as an etching-stopper. As a result, while the gate electrode 60 is not etched, the amorphous silicon layer 100' is sufficiently etched. Therefore, the instant embodiment reliably prevents over-etching of the gate electrode 60 even when the gate electrode 60 is relatively thin.

In the instant embodiment, the etching of the amorphous silicon layer 100 or polycrystalline silicon layer 100' may be carried out at 700° C. or a higher temperature. This contributes to increasing the etching speed, and reducing the time for the etching step of the amorphous silicon layer or polycrystalline silicon layer 100' than that in the first embodiment. Thus the second embodiment enhances the productivity of the semiconductor device and reduces its manufacturing cost.

Figure 19:
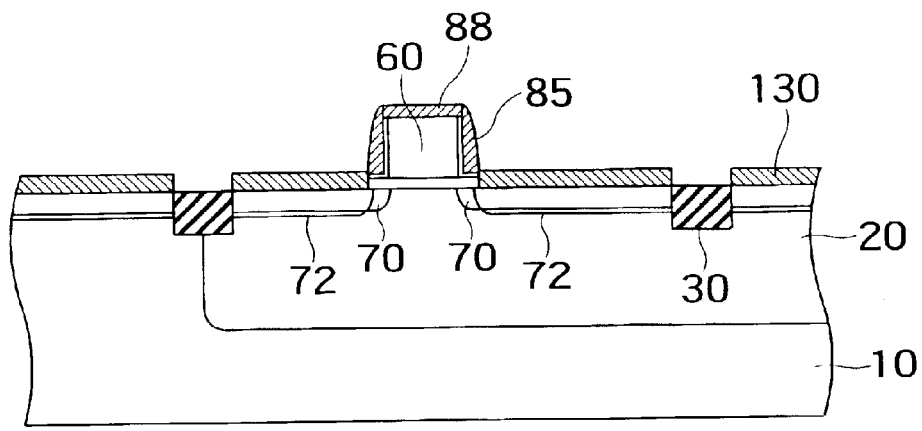
FIG. 19 is an enlarged cross-sectional view of the semiconductor substrate under a process continuous from FIG. 18 in the semiconductor device manufacturing method according to the second embodiment.
Figure 20:
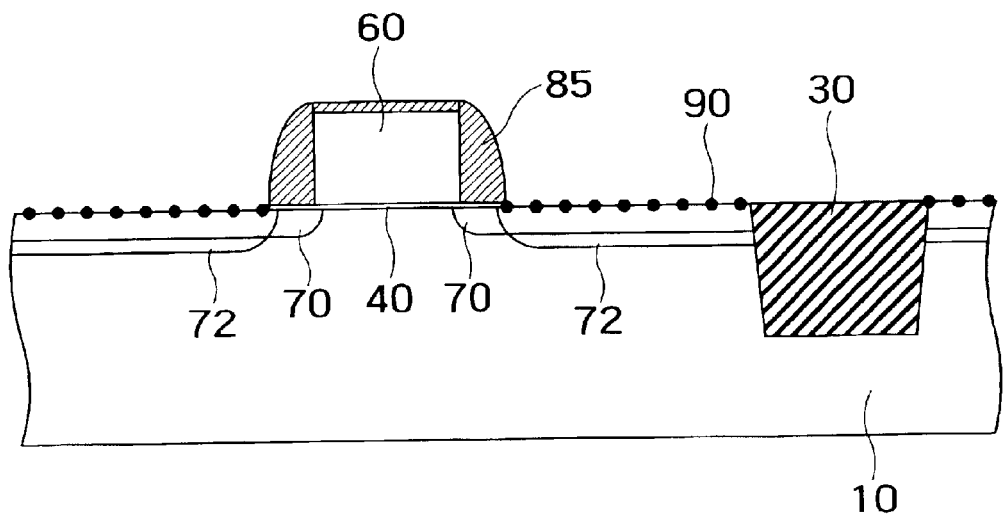
FIG. 20 is an enlarged cross-sectional view of a semiconductor substrate under a process of a conventional semiconductor device manufacturing process.
Figure 21:
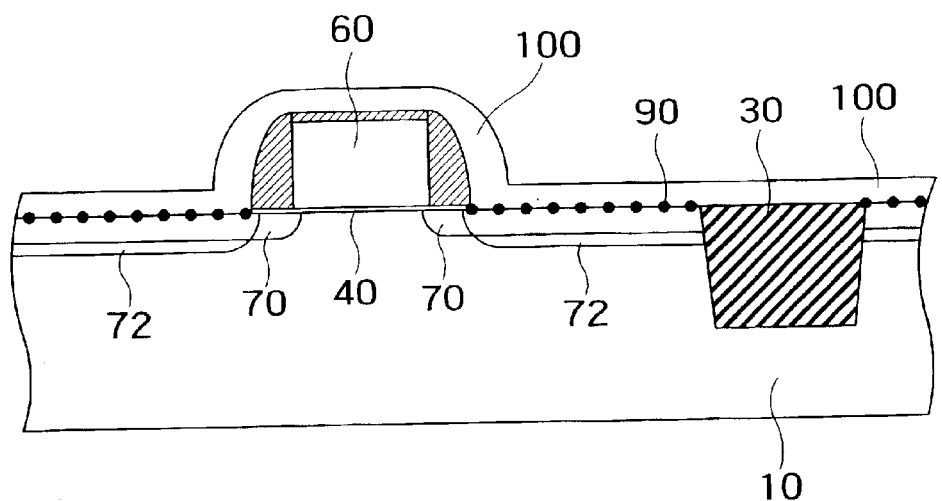
FIG. 21 is an enlarged cross-sectional view of a semiconductor substrate under a process of a conventional semiconductor device manufacturing process.
Figure 22:
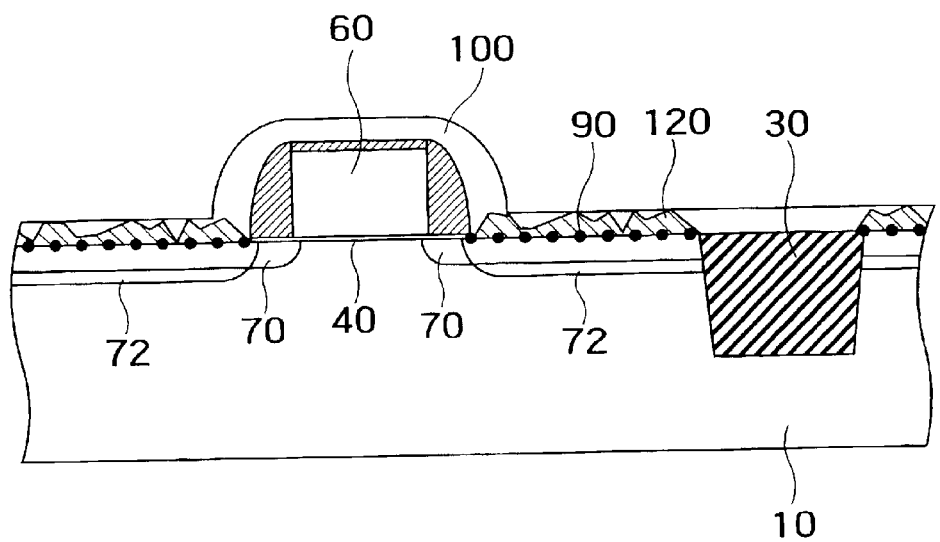
FIG. 22 is an enlarged cross-sectional view of a semiconductor substrate under a process of the conventional semiconductor device manufacturing process.
Figure 23:
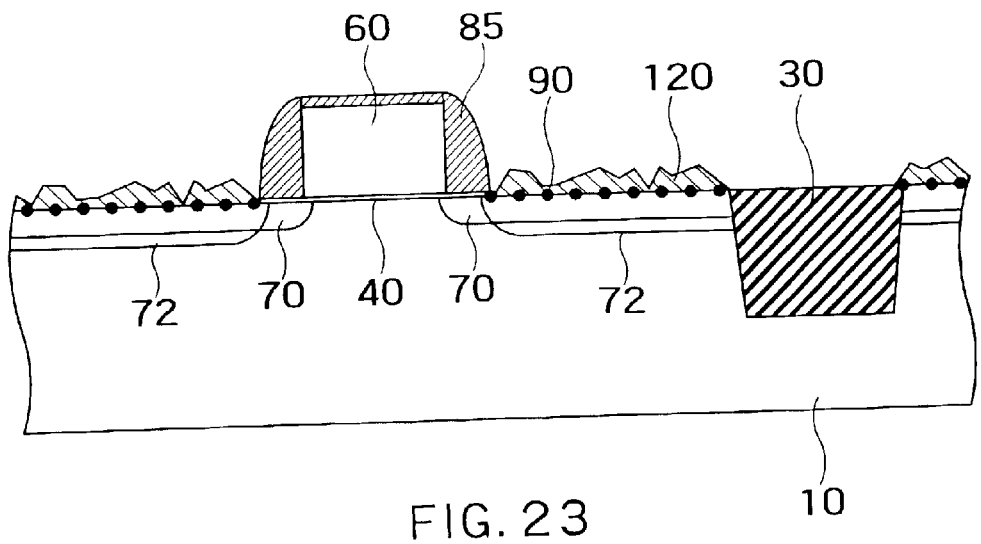
FIG. 23 is an enlarged cross-sectional view of a semiconductor substrate under a process of the conventional semiconductor device manufacturing process.
Figure 24:
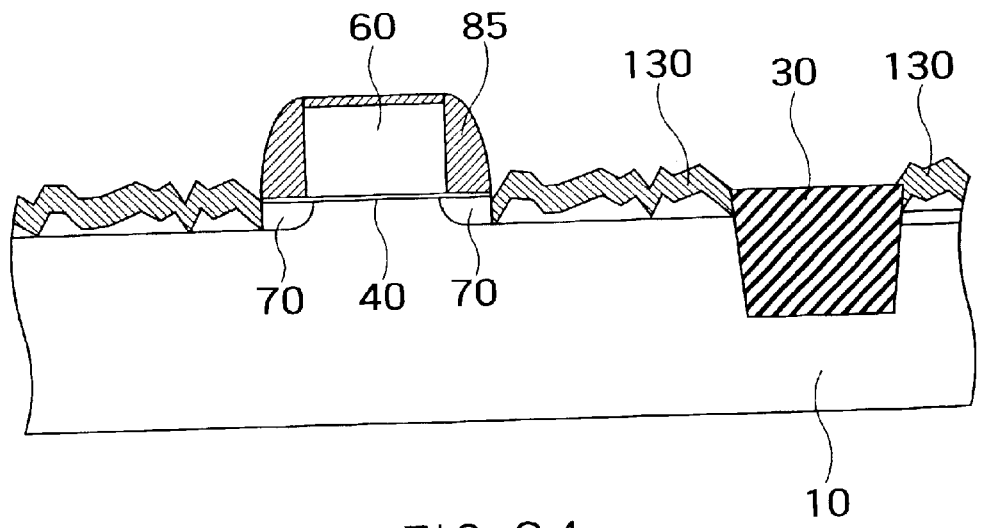
FIG. 24 is an enlarged cross-sectional view of a semiconductor substrate under a process of the conventional semiconductor device manufacturing process.

As shown in FIG. 19, a metal is deposited on the silicon single-crystal layer 120 to form the silicide layer 130 in the same manner as the first embodiment.

Through further steps, including the step of forming the contact and the step of forming the interconnections (not shown), the semiconductor device according to the instant embodiment is completed.

The second embodiment also has the same effects as those of the first embodiment. The second embodiment, which protects both the sidewall and the top surface of the gate electrode, need not take account of over-etching of the gate electrode 60. Additionally, the second embodiment has another effect, namely, shortening the time required for etching the amorphous silicon layer or polycrystalline silicon layer 100' than that of the first embodiment.

Even when replacing n-type semiconductors with p-type semiconductors and replacing p-type semiconductors with n-type semiconductors, effects of the second embodiment remain.

The semiconductor manufacturing method according to any of the foregoing embodiments can form the silicon single-crystal layer available for use with the Elevated Source-Drain technique on the source and drain diffusion layers at a relatively low temperature.

The semiconductor device according to any of the foregoing embodiments has the silicide layer made by the Elevated Source-Drain technique to be uniform in thickness and quality, and it is available for more enhanced microminiaturization than existing semiconductor devices while maintaining low contact resistance between the source and drain diffusion layers and the source and drain electrodes.

What is claimed is:

1. A semiconductor device comprising:

a semiconductor substrate;

a gate insulating film formed on the top surface of the semiconductor substrate;

a gate electrode formed on the gate insulating film;

diffusion layers formed in the semiconductor substrate to be used as a source layer and a drain layer; and a silicide layer formed to overlie the diffusion layers, wherein a concentration peak of an injection substance is substantially equal to the oxygen concentration peak at a depth from the top surface of the semiconductor substrate, said oxygen concentration peak being in a level lower than said top surface in a cross-section taken along a plane perpendicular to said top surface, said injection substance being injected through the interface between an amorphous layer deposited on the diffusion layer to form the silicide layer and said top surface.

2. The semiconductor device according to claim 1, wherein both of the depth of the oxygen concentration peak from said top surface and the depth of the concentration peak of the injection substance from said top surface are shallower than the depth of the diffusion layers from said top surface.

3. The semiconductor device according to claim 2, wherein concentration of the injection substance contained in each unit surface area of the semiconductor substrate is equal to or higher than the concentration of oxygen contained in the unit surface area of the semiconductor substrate.

4. The semiconductor device according to claim 1, wherein concentration of the injection substance contained in each unit surface area of the semiconductor substrate is equal to or higher than the concentration of oxygen contained in the unit surface area of the semiconductor substrate.

5. The semiconductor device according to claim 4, wherein the injection substance is germanium, its congener element, arsenic, its congener element, boron, its congener element, argon or its congener element.

6. The semiconductor device according to claim 1, wherein the injection substance is germanium, its congener element, arsenic, its congener element, boron, its congener element, argon or its congener element.

7. The semiconductor device according to claim 1, further comprising:

one or both of a sidewall protective layer covering the sidewall of the gate electrode and a top surface protective layer covering the top surface of the gate electrode.

8. The semiconductor device according to claim 1, further comprising:

an epitaxial single-crystal layer formed on the diffusion layers, wherein the silicide layer is formed on the epitaxial single-crystal layer.

9. A semiconductor device comprising:

a semiconductor substrate;

a gate insulating film formed on the top surface of the semiconductor substrate;

a gate electrode formed on the gate insulating film;

diffusion layers formed in the semiconductor substrate usable as a source layer and a drain layer; and a suicide layer formed to overlie the diffusion layers, wherein an oxygen concentration peak and a concentration peak of an injection substance are in a level lower than said top surface in a cross-section taken along a plane perpendicular to said top surface, and the injection substance is germanium, its congener element, arsenic, its congener element, boron, its congener element, argon or its congener element.

\* \* \* \* \*